United States Patent
Morishima (10) Patent No.: US 8,928,028 B2
(45) Date of Patent: Jan. 6, 2015

(54) ORGANIC ELECTROLUMINESCENCE ELEMENT INCLUDING METAL DOPED MOLYBDENUM OXIDE LAYER AND METHOD FOR PRODUCING THE SAME

(75) Inventor: Shinichi Morishima, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 12/672,146

(22) PCT Filed: Aug. 1, 2008

(86) PCT No.: PCT/JP2008/063841
§ 371 (c)(1),
(2), (4) Date: Feb. 4, 2010

(87) PCT Pub. No.: WO2009/022552
PCT Pub. Date: Feb. 19, 2009

(65) Prior Publication Data
US 2011/0068327 A1 Mar. 24, 2011

(30) Foreign Application Priority Data

Aug. 10, 2007 (JP) ................. 2007-210447

(51) Int. Cl.
| H01L 51/54 | (2006.01) |
| H01L 51/52 | (2006.01) |
| H01L 51/50 | (2006.01) |
| H05B 33/10 | (2006.01) |
| H05B 33/22 | (2006.01) |

(52) U.S. Cl.
CPC ........ *H01L 51/5052* (2013.01); *H01L 51/5088* (2013.01); *H05B 33/10* (2013.01); *H05B 33/22* (2013.01)
USPC ............................... 257/102; 257/40; 438/99

(58) Field of Classification Search
CPC ............ H01L 51/5088; H01L 51/5048; H01L 51/5052
USPC ...................... 257/101, 102; 438/99
See application file for complete search history.

(56) References Cited

U.S. PATENT DOCUMENTS

| 7,183,707 B2 | 2/2007 | Tyan et al. | |
| 8,003,055 B1 * | 8/2011 | Muradov | ......................... 422/86 |

(Continued)

FOREIGN PATENT DOCUMENTS

| CN | 1969384 A | 5/2005 |
| JP | 11-307259 A | 11/1999 |

(Continued)

OTHER PUBLICATIONS

Leem et al., "Low driving voltage and high stability organic light-emitting diodes with rhenium oxide-doped hole transporting layer." Appl. Phys. Lett. 91, 011113 (2007).*

(Continued)

*Primary Examiner* — Fernando L Toledo
*Assistant Examiner* — Peter Bradford
(74) *Attorney, Agent, or Firm* — Sughrue Mion, PLLC (57) ABSTRACT

It is an object of the present invention to provide an organic electroluminescence element which can be easily produced and has a good light-emitting property and a good lifetime property, and a method for producing the same.
That is, the present invention provides the organic electroluminescence element comprising an anode, a light-emitting layer and a cathode, and further comprising a metal doped molybdenum oxide layer provided between the anode and the light-emitting layer; and the method for producing the organic electroluminescence element including a stacking step to obtain a metal doped molybdenum oxide layer by simultaneously depositing molybdenum oxide and a dopant metal on another layer which constitutes the element.

7 Claims, 1 Drawing Sheet

(56) References Cited

U.S. PATENT DOCUMENTS

| | | |
|---|---|---|
| 2003/0169968 A1* | 9/2003 | Bazylenko et al. ............ 385/43 |
| 2005/0225234 A1* | 10/2005 | Tyan et al. .................... 313/504 |
| 2006/0007218 A1 | 1/2006 | Miyake et al. |
| 2006/0089006 A1* | 4/2006 | Katoda ......................... 438/758 |
| 2006/0157695 A1* | 7/2006 | Katoda ........................... 257/43 |
| 2006/0165572 A1 | 7/2006 | McHugh et al. |
| 2006/0262248 A1* | 11/2006 | Burberry et al. ............... 349/86 |
| 2007/0007882 A1 | 1/2007 | Fukuoka et al. |
| 2007/0065180 A1* | 3/2007 | Yatsunami .................... 399/220 |
| 2007/0290604 A1* | 12/2007 | Sakanoue et al. ............. 313/503 |
| 2009/0072217 A1* | 3/2009 | Klostermann ................... 257/4 |
| 2011/0143229 A1* | 6/2011 | Chellappa et al. ............ 429/410 |

FOREIGN PATENT DOCUMENTS

| | | | | |
|---|---|---|---|---|
| JP | 11307259 A | * | 11/1999 | ............ H05B 33/22 |
| JP | 2002-231054 A | | 8/2002 | |
| JP | 2002-367784 A | | 12/2002 | |
| JP | 2005259550 A | | 9/2005 | |
| JP | 2006-48015 A | | 2/2006 | |
| JP | 2007-500661 A | | 1/2007 | |
| JP | 2007201327 A | | 8/2007 | |
| TW | 200511890 | | 3/2005 | |
| WO | 2005009087 A1 | | 1/2005 | |
| WO | 2005/101540 A2 | | 10/2005 | |

OTHER PUBLICATIONS

Ikeda et al., "Low-Drive-Voltage OLEDs with a Buffer Layer Having Molybdenum Oxide." SID 06 Digest, p. 923.*

Machine translation of Suzuki, JP 2007-201327.*

S. Tokito et al., "Metal oxides as a hole-injecting layer for an organic electroluminescent device", Journal of Physics D. Applied Physics, IOP Publishing, Bristol, GB, vol. 29, No. 11, Nov. 14, 1996, pp. 2750-2753 (XP 000694594).

Japanese Patent Office, Notice of Rejection, issued in connection with Japanese Patent Application No. 2007-210447, dated Nov. 27, 2012.

Taiwanese Patent Office, "Preliminary Notice of First Office Action," issued in connection with Taiwanese Patent Application No. 097130375, dated Mar. 12, 2014.

* cited by examiner

US 8,928,028 B2

ORGANIC ELECTROLUMINESCENCE ELEMENT INCLUDING METAL DOPED MOLYBDENUM OXIDE LAYER AND METHOD FOR PRODUCING THE SAME

TECHNICAL FIELD

The present invention relates to an organic electroluminescence element (hereinafter sometimes also referred to as the organic EL element), and a method for producing the same.

BACKGROUND ART

Organic EL elements have various advantages that they can be driven at low voltage, have high luminance and easily emit lights having various colors compared with inorganic EL elements. Thus, various studies have been performed to obtain the elements having superior properties. In particular, many attempts to obtain materials for each layer which constitutes the element have been reported.

In particular, it has been studied to use metal oxide as the layer such as an electron injection layer or a hole injection layer. For example, it has been described in Patent Document 1 that an inorganic oxide layer such as a molybdenum oxide layer is provided as a highly efficient electron injection layer between a light-emitting layer and an electron injection electrode.

In order to enhance a property of the organic EL element, it is necessary to laminate multiple layers having various functions. Here, when the layer containing a polymer compound is laminated, a so-called wet process is typically used in terms of production cost. That is, a step of applying a solution obtained by dissolving the polymer compound in a solvent is performed. However, there is a problem that the molybdenum oxide layer has a low durability to the wet process, as a result, it is difficult to form the layer containing the polymer compound on the molybdenum oxide layer by the wet process and it is hard to enhance a light-emitting property and a lifetime property of the resulting organic EL element.

Patent Document 1: JP 2002-367784-A

DISCLOSURE OF INVENTION

Problem to be Solved by the Invention

It is an object of the present invention to provide an organic EL element which can be easily produced and has a good light-emitting property and a good lifetime property, and a method for producing the same.

Means for Solving Problem

As a result of an extensive study in the light of such a circumstance, the present inventors found that a durability of an inorganic oxide layer to a film forming process such as a wet process was enhanced by employing molybdenum oxide as a substance which constitutes the inorganic oxide layer and doping a metal to the molybdenum oxide, and therefore, the light-emitting property and the lifetime property of an element can be enhanced, and thus have completed the present invention.

According to the present invention, the following are provided:

[1] An organic electroluminescence element comprising an anode, a light-emitting layer and a cathode, and further comprising a metal doped molybdenum oxide layer provided between the anode and the light-emitting layer.

[2] The organic electroluminescence element according to the above [1], wherein the metal doped molybdenum oxide layer is a hole injection layer, or is provided in direct contact with the light-emitting layer or the hole injection layer.

[3] The organic electroluminescence element according to the above [1] or [2], wherein a visible light transmittance of the metal doped molybdenum oxide layer is 50% or more.

[4] The organic electroluminescence element according to any one of the above [1] to [3], wherein a dopant metal contained in the metal doped molybdenum oxide layer is selected from the group consisting of transition metals, Group III-B metals and mixtures thereof.

[5] The organic electroluminescence element according to the above [4], wherein the dopant metal is aluminium.

[6] The organic electroluminescence element according to any one of the above [1] to [5], wherein a content ratio of the dopant metal in the metal doped molybdenum oxide is 0.1 to 20.0 mol %.

[7] The organic electroluminescence element according to any one of the above [1] to [6], comprising a layer containing a polymer compound on the metal doped molybdenum oxide layer.

[8] A method for producing an organic electroluminescence element according to any one of the above [1] to [7], comprising a stacking step of simultaneously depositing molybdenum oxide and a dopant metal on any layer selected from the group consisting of an anode, a hole injection layer and a hole transport layer, to obtain a metal doped molybdenum.

[9] The method according to the above [8], wherein the stacking step is carried out by vacuum deposition, sputtering or ion plating.

[10] The method according to the above [9], wherein oxygen is introduced into an atmosphere in the stacking step.

[11] The method according to the above [8] further comprising a step of heating the metal doped molybdenum oxide layer subsequent to the stacking step.

EFFECT OF THE INVENTION

Figure 1:
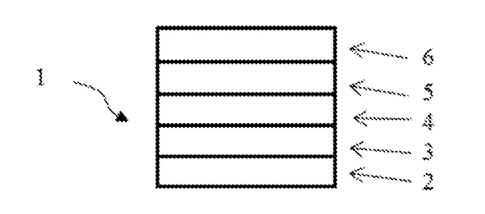
FIG. 1 represents an organic electroluminescence element according to an embodiment herein in which element 1 is an organic electroluminescence element, element 2 is an anode, element 3 is a metal doped molybdenum oxide layer, element 4 is a polymer layer, element 5 is a light-emitting layer, and element 6 is a cathode.

The organic EL element of the present invention can be easily produced because the inorganic oxide layer and the layer further stacked thereon can be provided easily with high quality, and has the good light-emitting property and the lifetime property. Therefore, the organic EL element of the present invention can be preferably used for a planar light source as a backlight and for a device such as a flat panel display.

BEST MODES FOR CARRYING OUT THE INVENTION

The organic EL element of the present invention has an anode, a light-emitting layer and a cathode. The organic EL element of the present invention may further have other layers between the anode and the light-emitting layer and/or between the light-emitting layer and the cathode, but has a metal doped molybdenum oxide layer as an essential component between the anode and the light-emitting layer, which is at least one layer among those layers.

The metal doped molybdenum oxide layer contains molybdenum oxide and a dopant metal, and preferably, it is substantially formed from the molybdenum oxide and the dopant metal. More specifically, when the metal doped molybdenum oxide layer is formed as a film of a single layer, a ratio of a sum of the molybdenum oxide and the dopant metal which occupy in a total amount of substances which constitute the layer may be preferably 98% by weight or more, more preferably 99% by weight or more and still more preferably 99.9% by weight or more.

The metal doped molybdenum oxide layer is preferably a hole injection layer or is provided in direct contact with the light-emitting layer or the hole injection layer. More specifically, it is preferable that the metal doped molybdenum oxide layer is any of the followings:
(i) it is provided in contact with the anode and a hole transport layer;
(ii) it is provided in contact with the anode and an electron block layer;
(iii) it is provided in contact with the hole injection layer and the light-emitting layer;
(iv) it is provided in contact with the hole injection layer and the electron block layer; or
(v) it is provided in contact with the anode and the light-emitting layer.

In the case of a bottom emission structure, (i) or (ii) is more preferable, and the metal doped molybdenum oxide layer generally works as the hole injection layer. In the case of a top emission structure, (iii) or (iv) is more preferable, and the metal doped molybdenum oxide layer generally works as the hole transport layer.

In terms of element properties, it is preferable to have a layer comprising a polymer compound on the metal doped molybdenum oxide layer. Here, the term of having the layer containing the polymer compound "on" the metal doped molybdenum oxide layer refers to a positional relation in which the metal doped molybdenum oxide layer is provided on a certain layer and further the layer comprising the polymer compound is provided thereon. For example, when the metal doped molybdenum oxide layer is provided on the anode, it means that the layer comprising the polymer compound is provided so as to arrange their positional relations: anode-metal doped molybdenum oxide layer-layer comprising the polymer compound.

A visible light transmittance of the metal doped molybdenum oxide layer is preferably 50% or more and 100% or less. By having the visible light transmittance of 50% or more and 100% or less, the organic EL element can be used suitably as a type which can emit the light going through the metal doped molybdenum oxide layer. The visible light transmittance is more preferably 70% or more and 100% or less. By having the visible light transmittance of 70% or more and 100% or less, the light from an inside deeper in the light-emitting layer can be taken out, thus enhancing a light-emitting efficiency of the organic EL element.

The dopant metal contained in the metal doped molybdenum oxide layer is preferably selected from the group consisting of transition metals, Group III-B metals and mixtures thereof, and is more preferably aluminium, nickel, copper, chromium, titanium, silver, gallium, zinc, neodymium, europium, holmium and cerium, and still more preferably aluminum. Meanwhile, as molybdenum oxide, it is preferable to employ $MoO_3$. When $MoO_3$ is formed onto a film by a deposition method such as a vacuum deposition, a composition ratio of Mo and O in the deposited film may be changed in some cases, but even in such a case the film can be preferably used for the present invention. The dopant metal contained in the metal doped molybdenum oxide layer may be used alone or in mixture of two or more.

A content ratio of the dopant metal to molybdenum oxide in the metal doped molybdenum oxide is preferably 0.1 to 20.0 mol %. By falling the content ratio of the dopant metal into the above range, a good process resistance can be obtained. The content ratio of the dopant metal to molybdenum oxide in the metal doped molybdenum oxide is more preferably 0.5 to 15.0 mol %.

A thickness of the metal doped molybdenum oxide layer is not particularly limited, but is preferably 1 to 100 nm.

A method for forming the metal doped molybdenum oxide layer into a film is not particularly limited, and preferable is a method in which molybdenum oxide and the dopant metal are deposited simultaneously on the other layer which constitutes the element to obtain the metal doped molybdenum oxide layer. Here, the other layer which constitutes the element may be any layer which constitutes the organic EL element, and may be appropriately selected depending on a production process and a stacked structure of the organic EL element to be obtained. For example, the metal doped molybdenum oxide layer in direct contact with an electrode may be obtained by depositing molybdenum oxide and the dopant metal on an anode layer or a cathode layer provided on a substrate. Alternatively, after providing the electrode on the substrate, one or more other layers such as a light-emitting layer, a charge injection layer, a charge transport layer or a charge block layer may be provided on the electrode, and molybdenum oxide and the dopant metal may be deposited further thereon to obtain the metal doped molybdenum oxide layer in direct contact with the layer. The deposition can be performed by, for example, the vacuum deposition, a molecular beam deposition, a sputtering, an ion plating or an ion beam deposition. A plasma assist vacuum deposition method in which a reactivity and a film forming property are enhanced by introducing the plasma into a film formation chamber may also be used. Among these specific examples, the vacuum deposition, the sputtering or the ion plating is preferable.

Examples of an evaporation source in the vacuum deposition method may include resistance heating, electron beam heating, high frequency induced heating and laser beam heating. As a simpler method, the resistance heating, the electron beam heating or the high frequency induced heating is preferable. The method of the sputtering (sputtering method) includes a DC sputtering method, an RF sputtering method, an ECR sputtering method, a conventional sputtering method, a magnetron sputtering method, an ion beam sputtering method and a facing target sputtering method, and any of them may be used. It is preferable to use the magnetron sputtering method, the ion beam sputtering method and the facing target sputtering method not to give damages to a lower layer. Upon forming the film, the film may also be formed in an atmosphere in which oxygen or a gas containing an oxygen element is introduced. As molybdenum oxide and a dopant metal material, typically $MoO_3$ and a single metal are used, but an Mo metal, $MoO_2$ and oxide of the dopant metal, an alloy of the dopant metal and Mo, or a mixture thereof may be used.

The deposited metal doped molybdenum oxide layer can be subjected to a stacking step of the other layer which constitutes the element, directly or after being optionally subjected to the other step such as heating, treatment with $UV-O_3$ or exposure to atmospheric air, and then the organic EL element can be completed.

The heating may be performed under a condition at 50 to 350° C. for 1 to 120 minutes. The treatment with UV-O$^3$ may be performed by exposing to ultraviolet ray at an intensity of 1 to 100 mW/cm$^2$ for 5 seconds to 30 minutes and treating under the atmosphere of ozone at a concentration of 0.001 to 99%. The exposure to the atmospheric air may be performed by leaving stand in the atmospheric air at a humidity of 40 to 95% at a temperature of 20 to 50° C. for 1 to 20 days.

Subsequently, the constitution of the layers of the organic EL element of the present invention will be described more specifically.

The organic EL element of the present invention has essentially the anode, the light-emitting layer and the cathode, and in addition thereto, may further have other layer between the anode and the light-emitting layer and/or between the light-emitting layer and the cathode.

Examples of the layer which may be provided between the cathode and the light-emitting layer may include an electron injection layer, an electron transport layer and a hole block layer. When both the electron injection layer and the electron transport layer are provided, the layer close to the cathode is the electron injection layer and the layer close to the light-emitting layer is the electron transport layer.

The electron injection layer is the layer having the function to improve an efficiency of the electron injection from the cathode, and the electron transport layer is the layer having the function to improve the transport of electron from the cathode, the electron injection layer or the electron transport layer closer to the cathode to the light-emitting layer. When the electron injection layer or the electron transport layer has the function to block the transport of holes, such a layer may also work as the hole block layer in some cases.

Having the function to block the transport of holes can be confirmed identified, for example, by making an element which runs a hole current alone and identifying a reduction of its current value.

Examples of the layer provided between the anode and the light-emitting layer may include a hole injection layer, a hole transport layer and an electron block layer. When both the hole injection layer and the hole transport layer are provided, the layer close to the anode is the hole injection layer and the layer close to the light-emitting layer is the hole transport layer.

The hole injection layer is the layer having the function to improve the efficiency of the hole injection from the anode, and the hole transport layer is the layer having the function to improve the transport of holes from the anode, the hole injection layer or the hole transport layer closer to the anode to the light-emitting layer. When the hole injection layer or the hole transport layer has the function to block the transport of electrons, such a layers may also work as the electron block layer in some cases.

Having the function to block the transport of electrons can be confirmed, for example, by making an element which runs an electron current alone and identifying the reduction of its current value.

In the organic EL element of the present invention, the light-emitting layer is generally provided as one layer, but is not limited thereto, and may be provided as two or more layers. In that case, the two or more light-emitting layers may be stacked in direct contact with one another, or the metal doped molybdenum oxide layer used for the present invention may be provided between such layers.

The electron injection layer and the hole injection layer may be collectively referred to as a charge injection layer, and the electron transport layer and the hole transport layer may be collectively referred to as a charge transport layer in some cases.

The organic EL element of the present invention may further have the following layer constitutions:
a) anode/hole transport layer/light-emitting layer/cathode
b) anode/hole transport layer/light-emitting layer/electron transport layer/cathode
c) anode/charge injection layer/light-emitting layer/cathode
d) anode/charge injection layer/light-emitting layer/charge injection layer/cathode
e) anode/charge injection layer/hole transport layer/light-emitting layer/cathode
f) anode/hole transport layer/light-emitting layer/charge injection layer/cathode
g) anode/charge injection layer/hole transport layer/light-emitting layer/charge injection layer/cathode
h) anode/charge injection layer/light-emitting layer/charge transport layer/cathode
i) anode/charge injection layer/light-emitting layer/electron transport layer/charge injection layer/cathode
j) anode/charge injection layer/hole transport layer/light-emitting layer/charge transport layer/cathode
k) anode/hole transport layer/light-emitting layer/electron transport layer/charge injection layer/cathode
l) anode/charge injection layer/hole transport layer/light-emitting layer/electron transport layer/charge injection layer/cathode
(Here, symbol "/" means that each layer is laminated adjacent to other layer, and same hereinafter.)

In each example of the above layer constitutions, the metal doped molybdenum oxide layer is provided as at least one layer of the charge injection layer and the hole transport layer.

The organic EL element may further have two or more light-emitting layers.

The organic EL element having two light-emitting layers may include specifically those having a layer constitution as follows:

m) anode/charge injection layer/hole transport layer/light-emitting layer/electron transport layer/charge injection layer/electrode/charge injection layer/hole transport layer/light-emitting layer/electron transport layer/charge injection layer/cathode.

The organic EL element having three or more light-emitting layers may include specifically those having a layer constitution containing two or more layers of a repeating unit, which is composed of electrode/charge injection layer/hole transport layer/light-emitting layer/electron transport layer/charge injection layer (hereinafter referred to as repeating unit A), and having constitution as follows:

n) anode/charge injection layer/hole transport layer/light-emitting layer/electron transport layer/charge injection layer/repeating unit A/repeating unit A . . . /cathode.

In the above layer constitutions m) and n), each layer other than the anode, the cathode, and the light-emitting layer may be omitted if necessary.

Here, the electrode is the layer which generates the hole and the electron by applying an electric field thereto. Examples of materials which constitute the electrode may include vanadium oxide, indium tin oxide and molybdenum oxide.

In each example of the above layer constitutions m) and n), the metal doped molybdenum oxide layer is provided as at least one of the charge injection layer, the hole transport layer and the electrode.

The organic EL element of the present invention may further have a substrate, and the above respective layers may be provided on the substrate. The organic EL element of the present invention may further have a member for sealing on a side opposed to the substrate with sandwiching the above respective layers therebetween. The organic EL element having the substrate and the above layer constitution generally has the substrate on the side of the anode, but is not limited thereto in the present invention, and may have the substrate on either side of the anode or the cathode.

In order to emit the light from the light-emitting layer, generally, the entire layers in either one side of the light-emitting layer are transparent in the organic EL element of the present invention. Specifically, for example, when the organic EL element has the constitution of a substrate/anode/charge injection layer/hole transport layer/light-emitting layer/electron transport layer/charge injection layer/cathode/sealing member, all of the substrate, the anode, the charge injection layer and the hole transport layer are made transparent to make a so-called bottom emission type element, or alternatively all of the electron transport layer, the charge injection layer, the cathode and the sealing member are transparent to make a element of a so-called top emission type. When the organic EL element has the constitution of a substrate/cathode/charge injection layer/electron transport layer/light-emitting layer/hole transport layer/charge injection layer/anode/sealing member, all of the substrate, the cathode, the charge injection layer and electron transport layer are transparent to make the element of the so-called bottom emission type element, or alternatively all of the hole transport layer, the charge injection layer, the anode and the sealing member are transparent to make the element of the so-called top emission type element. Here, transparent of visible light transmittance from the light-emitting layer to the layer which emit the light is preferably 40% or more. When the light in an ultraviolet region or an infrared region is required to be emitted in the element, it is preferable to have the transmittance of 40% or more in the corresponding region.

In the organic EL element of the present invention, the charge injection layer or an insulating layer having a film thickness of 2 nm or less may further be provided adjacent to the electrode in order to enhance a tight adhesiveness to the electrode and improve the charge injection from the electrode, and a thin buffer layer may be inserted in an interface of the charge transport layer or the light-emitting layer in order to enhance the tight adhesiveness of the interface and prevent an intermixture.

An order and a number of the layers to be laminated and the thickness of each layer may be appropriately employed by taking the luminescence efficiency and the lifetime of the element into consideration.

Subsequently, materials for and a method for the formation of each layer which constitutes the organic EL element of the present invention will be described more specifically.

<Substrate>

The substrate which constitutes the organic EL element of the present invention is not particularly limited as long as the substrate is not changed when the electrode is formed and the organic layers are formed thereon, and usable examples may include a glass material, a plastic material, a polymer film, a silicon substrate and one obtained by laminating them are used. The substrate is commercially available or may be produced by a publicly known method.

<Anode>

It is preferable to use a transparent or translucent electrode as the anode of the organic EL element of the present invention because the element which emits the light through the anode can be composed. As such a transparent electrode or a translucent electrode, a thin film of metal oxide, metal sulfide or a metal having a high electric conductivity may be used, those having the high transmittance may be suitably utilized, and they may be appropriately selected and used depending on the organic layer to be used. Specifically, usable examples may include indium oxide, zinc oxide, tin oxide; and films, such as NESA, made of a conductive glass composed of a complex thereof such as indium tin oxide (ITO) and indium zinc oxide; and gold, platinum, silver and copper, and preferable are ITO, indium zinc oxide and tin oxide. Example of the method for producing the anode may include the vacuum deposition method, the sputtering method, the ion plating method and a plating method. An organic transparent conductive film of polyaniline or a derivative thereof, or polythiophene or a derivative thereof may also be used as the anode.

A material which reflects the light may be used as the anode, and the metal, metal oxide and sulfide oxide having a work function of 3.0 eV or more are preferable as such a material.

The film thickness of the anode can be appropriately selected in consideration of light transmittance and electric conductivity, and is for example 10 nm to 10 μm, preferably 20 nm to 1 μm and more preferably 50 nm to 500 nm.

<Hole Injection Layer>

The hole injection layer may be provided between the anode and the hole transport layer or between the anode and the light-emitting layer. In the particularly preferable embodiment of the present invention, the metal doped molybdenum oxide layer may be used as the hole injection layer.

In the organic EL element of the present invention, when the metal doped molybdenum oxide layer is used as the layer other than the hole injection layer, examples of materials which form the hole injection layer may include phenylamine-based materials, starburst type amine-based materials, phthalocyanine-based materials, oxides such as vanadium oxide, tantalum oxide, tungsten oxide, molybdenum oxide, ruthenium oxide and aluminium oxide, amorphous carbon, polyaniline and polythiophene derivatives.

<Hole Transport Layer>

The metal doped molybdenum oxide layer may be used as the hole transport layer in some cases, but in the cases other than that, examples of the materials which constitute the hole transport layer may include polyvinyl carbazole or derivatives thereof, polysilane or derivatives thereof, polysiloxane derivatives having aromatic amine in a side chain or a main chain, pyrazoline derivatives, arylamine derivatives, stilbene derivatives, triphenyldiamine derivatives, polyaniline or derivatives thereof, polythiophene or derivatives thereof, polyarylamine or derivatives thereof, polypyrrol or derivatives thereof, poly(p-phenylene-vinylene) or derivatives thereof, and poly(2,5-thienylene-vinylene) or derivatives thereof.

Among them, as the hole transport materials used for the hole transport layer, preferable are macromolecular hole transport materials such as polyvinyl carbazole or derivatives thereof, polysilane or derivatives thereof, polysiloxane derivatives having aromatic amine group in the side chain or the main chain, polyaniline or derivatives thereof, polythiophene or derivatives thereof, polyarylamine or derivatives thereof, polypyrrol or derivatives thereof, poly(p-phenylene-vinylene) or derivatives thereof, or poly(2,5-thienylene-vinylene) or derivatives thereof. More preferable are polyvinyl carbazole or derivatives thereof, polysilane or derivatives thereof and polysiloxane derivatives having aromatic amine in the side chain or the main chain. In the case of low molecular hole transport materials, it is preferable to use the material by dispersing it in a polymer binder.

The method for forming the film of the hole transport layer is not limited, and for the low molecular hole transport material, the method for forming the film from a solution mixed with the polymer binder is shown as an example. For the macromolecular hole transport material, the method for forming the film from the solution is shown as an example.

A solvent used for forming the film from the solution is not particularly limited as long as the hole transport material is dissolved therein. Examples of the solvent may include chlorine-based solvents such as chloroform, methylene chloride and dichloroethane, ether-based solvents such as tetrahydrofuran, aromatic hydrocarbon-based solvents such as toluene and xylene, ketone-based solvent such as acetone and methyl ethyl ketone, and ester-based solvents such as ethyl acetate, butyl acetate and ethyl cellosolve acetate.

Methods for forming the film from the solvent may include applying methods such as coating methods such as a spin coating method, a casting method, a microgravure coating method, a gravure coating method, a bar coating method, a roll coating method, a wire bar coating method, a dip coating method, a slit coating method, a capillary coating method, a spray coating method and a nozzle coating method; and printing methods such as a gravure printing method, a screen printing method, a flexographic printing method, an offset printing method, a reverse printing method and an inkjet printing method from the solution. The printing methods such as the gravure printing method, the screen printing method, the flexographic printing method, the offset printing method, the reverse printing method and the inkjet printing method are preferable in terms of easy pattern formation.

As the polymer binder to be mixed, those which do not inhibit the charge transport excessively are preferable and those having a mild absorption of the visible light are suitably used. Examples of the polymer binder may include polycarbonate, polyacrylate, polymethyl acrylate, polymethyl methacrylate, polystyrene, polyvinyl chloride and polysiloxane.

The film thickness of the hole transport layer has varying optimal values depending on the material to be used, and can be selected to have appropriate values in driving voltage and luminescence efficiency, but needs the thickness at least not to cause a pinhole. The excessively thick thickness is not preferable because the driving voltage of the element becomes high. Therefore, the film thickness of the hole transport layer is, for example, 1 nm to 1 µm preferably 2 nm to 500 nm and more preferably 5 nm to 200 nm.

<Light-Emitting Layer>

The light-emitting layer in the present invention is preferably an organic light-emitting layer, and generally has an organic matter (low molecular compound and macromolecular compound) which mainly emits fluorescence or phosphorescence. The light-emitting layer may further contain a dopant material. Examples of materials which form the light-emitting layer to be used in the present invention may include the following luminescent materials.

Dye Materials

Examples of the dye material may include cyclopendamine or derivatives thereof, tetraphenylbutadiene or derivatives thereof, triphenylamine or derivatives thereof, oxadiazole or derivatives thereof, pyrazoloquinoline or derivatives thereof, distylylbenzene or derivatives thereof, distylylarylene or derivatives thereof, pyrrol or derivatives thereof, thiophene ring compounds, pyridine ring compounds, perinone or derivatives thereof, perylene or derivatives thereof, oligothiophene or derivatives thereof, trifumanylamine or derivatives thereof, oxadiazole dimers, pyrazoline dimers, quinacridone or derivatives thereof, coumarin or derivatives thereof, rubrene or derivatives thereof, squarium or derivatives thereof, porphyrin or derivatives thereof, stylyl-based dyestuffs, tetracene or derivatives thereof, pyrazolone or derivatives thereof, decacyclene and phenoxazone.

Metal Complex Materials

Examples of the metal complex materials may include metal complexes having the luminescence from a triplet excitation state such as iridium complexes and platinum complexes; and metal complexes such as aluminum quinolinol complexs, benzoquinolinol beryllium complexes, benzoxazolyl zinc complexes, benzothiazole zinc complexes, azomethyl zinc complexes, porphyrin zinc complexes, and europium complexes; and in addition, metal complexes having Al, Zn, Be or a rare earth metal such as Tb, Eu or Dy as a center metal and having an oxadiazole, thiadiazole, phenylpyridine, phenylbenzimidazole or quinoline structure as a ligand.

Polymer Materials

Examples of the polymer materials may include polyparaphenylene vinylene or derivatives thereof, polythiophene or derivatives thereof, polyparaphenylene or derivatives thereof, polysilane or derivatives thereof, polyacetylene or derivatives thereof, polyfluorene or derivatives thereof, polyvinylcarbazole or derivatives thereof, and those obtained by polymerizing the above dyestuff-based materials or the metal complex-based materials.

Among the above light-emitting materials, the material which emits blue light may include distylylarylene or derivatives thereof, oxadiazole or derivatives thereof and polymers thereof, polyvinylcarbazole or derivatives thereof, polyparaphenylene or derivatives thereof and polyfluorene or derivatives thereof. Among them, the polyvinylcarbazole or derivatives thereof, the polyparaphenylene or derivatives thereof and the polyfluorene or derivatives thereof which are the polymer materials are preferable.

The material which emits green light may include quinacridone or derivatives thereof, coumarin or derivatives thereof and polymers thereof, polyparaphenylene vinylene or derivatives thereof and polyfluorene or derivatives thereof. Among them, the polyparaphenylene vinylene or derivatives thereof and the polyfluorene or derivatives thereof which are the polymer-based materials are preferable.

The material which emits red light may include coumarin or derivatives thereof, thiophene ring compounds and polymers thereof, polyparaphenylene vinylene or derivatives thereof, polythiophene or derivatives thereof and polyfluorene or derivatives thereof. Among them, the polyparaphenylene vinylene or derivatives thereof, the polythiophene or derivatives thereof and the polyfluorene or derivatives thereof which are the polymer-based materials are preferable.

Dopant Materials

A dopant may be added in the light-emitting layer for the purpose of enhancing the luminescence efficiency and changing a luminescence wavelength. Examples of such a dopant may include perylene or derivatives thereof, coumarin or derivatives thereof, rubrene or derivatives thereof, quinacridone or derivatives thereof, squarium or derivatives thereof, porphyrin or derivatives thereof, stylyl-based dyestuffs, tetracene or derivatives thereof, pyrazolone or derivatives thereof, decacyclene and phenoxazone. The thickness of such a light-emitting layer is generally about 2 to 200 nm.

<Method for Forming Film of Light-Emitting Layer>

As the method for forming the film of the light-emitting layer containing the organic matter, the method for applying the solution containing the light-emitting material on or above the substrate, the vacuum deposition method or a transfer method may be used. Specific examples of the solvent used for forming the film from the solution may include the same solvents as those in which the hole transport material is dissolved when the film of the hole transport layer is formed from the solution.

Usable examples of methods for applying the solution containing the light-emitting material on or above the substrate may include the applying methods: the coating methods such as the spin coating method, the casting method, the microgravure coating method, the gravure coating method, the bar coating method, the roll coating method, the wire bar coating method, the dip coating method, the slit coating method, the capillary coating method, the spray coating method and the nozzle coating method; and the printing methods such as the gravure printing method, the screen printing method, the flexographic printing method, the offset printing method, the reverse printing method and the inkjet printing method. The printing methods such as the gravure printing method, the screen printing method, the flexographic printing method, the offset printing method, the reverse printing method and the inkjet printing method are preferable in terms of easy pattern formation and easy color coding. In the case of a sublimatic low molecular compound, the vacuum deposition method may be used. In addition, the light-emitting layer may be formed only on a desired place by laser transfer or thermal transfer.

<Electron Transport Layer>

As the electron transport layer, those known publicly can be used, and examples may include oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, metal complexes with 8-hydroxyquinoline or derivatives thereof, polyquinoline or derivatives thereof, polyquinoxaline or derivatives thereof, and polyfluorene or derivatives thereof are exemplified.

Among them, preferable are the oxadiazole derivatives, benzoquinone or the derivatives thereof, anthraquinone or the derivatives thereof, or the metal complexes with 8-hydroxyquinoline or the derivatives thereof, polyquinoline or the derivatives thereof, polyquinoxaline or derivatives thereof, and polyfluorene or derivatives thereof, and more preferable are 2-(4-biphenyl)-5-(4-t-butylphenyl)-1,3,4-oxadiazole, benzoquinone, anthraquinone, tris(8-quinolinol)aluminium and polyquinoline.

The method for forming the film of the electron transport layer is not particularly limited. The vacuum deposition method from powder or the method for forming the film from the solution or a melted state is shown as an example for low molecular electron transport materials. The method for forming the film from the solution or the melted state is shown as an example for in macromolecular electron transport materials. The polymer binder may be combined when the film is formed from the solution or the melted state. The method for forming the film of the electron transport layer from the solution may include the same method for forming the film as the aforementioned method for forming the film of the hole transport layer from the solution.

The film thickness of the electron transport layer has the varying optimal value depending on the material to be used, and may be selected to have appropriate values in driving voltage and luminescence efficiency, but needs the thickness at least not to cause the pinhole. The excessively thick thickness is not preferable because the driving voltage of the element becomes high. Therefore, the film thickness of the electron transport layer is, for example, 1 nm to 1 μm, preferably 2 nm to 500 nm and more preferably 5 nm to 200 nm.

<Electron Injection Layer>

The electron injection layer is provided between the electron transport layer and the cathode or between the light-emitting layer and the cathode. The electron injection layer may include alkali metals, alkali earth metals, or alloys containing one or more of the metals, or oxide, halide and carbonate of the metals, or mixtures of the metals depending on the type of the light-emitting layer. Examples of the alkali metal and oxide, halide and carbonate thereof may include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride and lithium carbonate. Examples of the alkali earth metal, and oxide, halide and carbonate thereof may include magnesium, calcium, barium, strontium, magnesium oxide, magnesium fluoride, calcium oxide, calcium fluoride, barium oxide, barium fluoride, strontium oxide, strontium fluoride and magnesium carbonate. The electron injection layer may be formed by stacking two or more layers. Specifically, LiF/Ca and the like may be included. The electron injection layer is formed by the deposition method, the sputtering method or the printing method. The film thickness of the electron injection layer is preferably about 1 nm to 1 μm.

<Cathode Material>

As the cathode material used in the organic EL element of the present invention, the material in which the work function is small and the electron is easily injected into the light-emitting layer and/or the material in which the electric conductivity is high and/or the material in which a reflectance of the visible light is high is preferable. As the metals, the alkali metals, the alkali earth metals, transition metals and metals in Group III-B may be used. Usable examples may include the metals such as lithium, sodium, potassium, rubidium, cesium, beryllium, magnesium, calcium, strontium, barium, aluminium, scandium, vanadium, zinc, yttrium, indium, cerium, samarium, europium, terbium and ytterbium; alloys of two or more of the above metals; alloys of one or more of the above alloys and the metals with one or more of gold, silver, platinum, copper, manganese, titanium, cobalt, nickel, tungsten and tin; and graphite or graphite intercalational compounds. Examples of the alloy may include magnesium-silver alloys, magnesium-indium alloys, magnesium-aluminium alloys, indium-silver alloys, lithium-aluminium alloys, lithium-magnesium alloys, lithium-indium alloys and calcium-aluminium alloys. A transparent conductive electrode may be used as the cathode, and for example, conductive metal oxide and conductive organic matters may be used. Specifically, indium oxide, zinc oxide, and indium tin oxide (ITO) and indium zinc oxide (IZO) which are complexes thereof may be used as the conductive metal oxide, and organic transparent conductive films of polyaniline or derivatives thereof and polythiophene or derivatives thereof as the conductive organic matters may be used. The cathode may be formed into a laminated structure of two or more layers. The electron injection layer is used as the cathode in some cases.

The film thickness of the cathode can be appropriately selected in consideration of electric conductivity and durability, and is, for example, 10 nm to 10 μm, preferably 20 nm to 1 μm and more preferably 50 nm to 500 nm.

Methods such as the vacuum deposition method, the sputtering method and a lamination method in which a metal thin film is bonded with pressure is used for producing the cathode.

<Insulating Layer>

The insulating layer having the film thickness of 2 nm or less, which the organic EL element of the present invention has optionally, has the function to make the electron injection easy. Materials of the insulating layer may include metal fluoride, metal oxide and organic insulating materials. The organic EL element provided with the insulating layer having the film thickness of 2 nm or less may include those provided with the insulating layer having the film thickness of 2 nm or less adjacent to the cathode and those provided with the insulating layer having the film thickness of 2 nm or less adjacent to the anode.

The organic EL element of the present invention may be used as a planer light source as well as a backlight of a segment display device, a dot-matrix display device and a liquid crystal display device.

In order to obtain planarly light-emitting using the organic EL element of the present invention, the planar anode and cathode may be disposed to be superimposed each other. For obtaining the light-emitting having a pattern, there are methods: a mask provided with windows having the pattern is disposed on the surface of the planar light-emitting element; the organic layer in a non-light-emitting portion is extremely thickened to substantially not emit the light; and either or both the anode or/and the cathode are formed to have the pattern. A segment type display element which can display numerals, letters and simple signs is obtained by forming the pattern by any of the above methods and disposing some electrodes to turn ON/OFF independently. Furthermore, for obtaining a dot-matrix element, it is available that both the anode and the cathode are formed so as to have a stripe and disposed to be mutually orthogonalized. A partial color display and a multicolor display become possible by the method of separately coating multiple kinds of the light-emitting materials having the different light color or the method of using a color filter or a fluorescence conversion filter. The dot-matrix element can be driven passively or may be driven actively by combining with TFT. These display elements can be used as the display devices of computers, televisions, mobile terminals, mobile phones, car navigations and view finders of video cameras.

Moreover, the planar light-emitting element is a self-light-emitting thin type, and can be used suitably as the planar light source for the backlight of the liquid crystal display device or the planar light source for lighting. If a flexible substrate is used, the light-emitting element can be used as the light source and the display device having a curved surface.

EXAMPLES

The present invention will be described in more detail below with reference to Examples and Comparative Examples, but the present invention is not limited thereto.

Example 1

1-1. Deposition of al Doped $MoO_3$ onto Glass Substrate by Vacuum Deposition Method Glass substrates were prepared. One side thereof was partially covered using a deposition mask, and the substrates were attached in a deposition chamber using a substrate holder.

$MoO_3$ powder (purity 99.99%, supplied from Aldrich) was packed in a box type tungsten board for sublimation materials, which was covered with a cover having holes not to spatter the powder and was set in the deposition chamber. Al (purity 99.999%, supplied from Japan Pure Chemical Co., Ltd.) was placed in a crucible and set in the deposition chamber.

A vacuum degree in the deposition chamber was $3 \times 10^{-5}$ Pa or less. $MoO_3$ was gradually heated by a resistance heating method and degassing was thoroughly performed. Al was melted in the crucible by electron beam and degassing was thoroughly performed. Then, $MoO_3$ and Al were subjected to the deposition. The vacuum degree was $9 \times 10^{-5}$ Pa or less during the deposition. A film thickness and a deposition rate were always monitored by a quartz crystal oscillator. A main shutter was opened to start film formation on the substrate when the deposition rate of $MoO_3$ became about 0.25 nm/second and the deposition rate of Al became about 0.01 nm/second. The substrate was rotated during the deposition to make the film thickness uniform. The deposition rate was controlled to the above speed and the film was formed for about 36 seconds, thus obtaining the substrate provided with a co-deposited film having the film thickness of about 10 nm. A composition ratio of Al to a sum of $MoO_3$ and Al in the film was about 3.5 mol %.

1-2. Durability Test

After forming the film, the obtained substrate was brought out in the atmosphere, a film surface was observed by an optical microscope (500 times); then, no crystal structure was observed and it was confirmed to be an amorphous state.

The obtained substrate was exposed to pure water for one minute, observed again by the optical microscope; then, no change was observed and the surface was not melted. This substrate was further continued to be exposed to the pure water for 3 minutes or the film was wiped with nonwoven fabric (product name "Bemcot" supplied from Ozu Corporation) impregnated with the pure water. Subsequently, the film was observed visually; then, the film was left with no change in both the cases.

The separately obtained substrate was exposed to acetone for one minute, observed by the optical microscope; then, no change was observed and the surface was not melted. This substrate was further continued to be exposed to acetone for 3 minutes or the film was wiped with the nonwoven fabric impregnated with acetone. Subsequently, the film was observed visually; then, the film was left with no change in both the cases.

1-3. Measurement of Transmittance

A transmittance of the deposition film after forming the film was measured using a transmittance reflectance measurement apparatus FilmTek 3000 (product name, supplied from Scientific Computing International). Results are shown in Table 1. A transmission spectrum began to be observed at a light wavelength of about 300 nm, and the transmittance at the wavelength of 320 nm was 21.6%, and the transmittance at the wavelength of 360 nm was 56.6%. Compared with Comparative Example 1 described later, this film had the transmittance of 3.6 times at 320 nm and 1.6 times at 360 nm.

Example 2

A substrate provided with a co-deposited film was obtained in the same manner as in Example 1 (1-1), except that oxygen was introduced into the chamber during the deposition. An amount of oxygen was controlled to 15 sccm by a mass flow controller. The vacuum degree during the deposition was about $2.3 \times 10^{-3}$ Pa. The film thickness of the obtained co-deposition film was 10 nm. The composition ratio of Al to the sum of $MoO_3$ and Al in the film was about 3.5 mol %.

After forming the film, the durability of the obtained substrate was evaluated in the same manner as in Example 1 (1-2). In both the cases of being exposed to the pure water and acetone, no change was observed.

Example 3

A substrate provided with a co-deposited film was obtained in the same manner as in Example 1 (1-1), except that the deposition rate of $MoO_3$ was controlled to about 0.37 nm/second and the deposition rate of Al was controlled to about 0.001 nm/second. The film thickness of the obtained co-deposited film was 10 nm. The composition ratio of Al to the sum of $MoO_3$ and Al in the film was about 1.3 mol %.

After forming the film, the durability of the obtained substrate was evaluated in the same manner as in Example 1 (1-2). In both the cases of being exposed to the pure water and acetone, no change was observed.

Example 4

The substrate obtained in Example 1 (1-1) was placed in a clean oven under the air atmosphere, and heated at 250° C. for 60 minutes. After cooling, the transmittance of the deposition film was measured in the same manner as in Example 1 (1-3). The results are shown in Table 1. The transmittance at the wavelength of 320 nm was 28.9%, and the transmittance at the wavelength of 360 nm was 76.2%. Compared with Comparative Example 1 described later, this film had the transmittance of 4.7 times at 320 nm and 2.2 times at 360 nm.

Comparative Example 1

A substrate provided with a deposition film having the film thickness of about 10 nm was obtained by operating in the same manner as in Example 1, except that Al was not deposited and $MoO_3$ alone was deposited at about 0.28 nm/second.

After forming the film, the obtained substrate was brought out in the atmosphere, the film surface was observed by the optical microscope (500 times), and no crystal structure was observed and it was confirmed to be the amorphous state.

The obtained substrate was exposed to pure water for one minute, observed again by the optical microscope; then, a bleeding pattern was observed and it was observed that the surface was melted. This substrate was further continued to be exposed to the pure water for 3 minutes or the film was wiped with the nonwoven impregnated with the pure water. Subsequently, the substrate was visually observed; then, the film disappeared in both the cases.

The separately obtained substrate was exposed to acetone for one minute, observed again by the optical microscope, and bleeding pattern was observed and it was observed that the surface was melted. This substrate was further continued to be exposed to the pure water for 3 minutes or the film was wiped with the nonwoven impregnated with acetone. Subsequently, the substrate was visually observed; then, the film disappeared in both the cases.

The transmittance of the deposition film after forming the film was measured in the same manner as in Example 1 (1-3). The results are shown in Table 1. The transmittance at the wavelength of 320 nm was 6.1%, and the transmittance at the wavelength of 360 nm was 35.4%. respectively. It was confirmed that the transmittance was low.

TABLE 1

| | Transmittance (%) in films formed under each condition | | | |
|---|---|---|---|---|
| | Wavelength (nm) | | | |
| | 300 | 320 | 340 | 360 |
| Example 1 | 3.3 | 21.6 | 43.2 | 56.6 |
| Example 4 | 4.2 | 28.9 | 59.5 | 76.2 |
| Comparative Example 1 | 1.7 | 6.1 | 18.2 | 35.4 |

Synthesis Example 1

In a separable flask equipped with a stirring blade, a baffle, a nitrogen introducing tube whose length was adjustable, a cooling tube and a thermometer, 158.29 parts by weight of 2,7-bis(1,3,2-dioxaborolane-2-yl)-9,9-dioctylfluorene, 136.11 parts by weight of bis-(4-bromophenyl)-4-(1-methylpropyl)-benzeneamine, 27 parts by weight of tricaprylmethylammonium chloride (Aliquat 336, supplied from Henkel) and 1800 parts by weight of toluene were placed, stirred with running nitrogen from the nitrogen introducing tube, and a temperature was raised to 90° C. Subsequently, 0.066 parts by weight of palladium (II) acetate and 0.45 parts by weight of tri(o-toluyl)phosphine were added, and then 573 parts by weight of an aqueous solution of 17.5% sodium carbonate was dropped over one hour. After completion of dropping, the nitrogen introducing tube was pulled up from a solution surface, and the temperature was kept for 7 hours under reflux. Subsequently, 3.6 parts by weight of phenyl borate was added, the temperature was kept for 14 hours under the reflux, and then cooled to room temperature. After removing a reaction solution aqueous layer, a reaction solution oil layer was diluted with toluene, and washed with an aqueous solution of 3% acetic acid and ion-exchange water. To the separated oil layer, 13 parts by weight of sodium N,N-diethyl dithiocarbamate trihydrate was added, which was then stirred for 4 hours. The resulting solution was passed through a column of an active alumina and silica gel mixture, and the column was washed by passing toluene. After mixing a filtrate and a washing solution, the resulting mixture was dropped in methanol to precipitate a polymer. The resulting polymer was separated by filtration, washed with methanol and dried using a vacuum dryer, thus yielding 192 parts by weight of the polymer. The obtained polymer is referred to as a polymer compound 1. A weight average molecular weight and a number average molecular weight in terms of polystyrene of the polymer compound 1 were obtained by the following GPC analysis method, and its weight average molecular weight and number average molecular weight in terms of polystyrene were $3.7 \times 10^5$ and $8.9 \times 10^4$, respectively.

GPC Analysis Method

The weight average molecular weight and number average molecular weight in terms of polystyrene were obtained by gel permeation chromatography (GPC). Standard polystyrene produced by Polymer Laboratories was used for preparing a working curve for GPC. The polymer to be measured was dissolved in tetrahydrofuran at a concentration of about 0.02% by weight, and 10 μL thereof was injected in a GPC apparatus.

LC10ADvp supplied from Shimadzu Corporation was employed as the GPC apparatus. Two PLgel 10 μm MIXED-B columns (300×7.5 mm) supplied from Polymer Laboratories were tandemly connected to use as the column. Tetrahydrofuran was run at 1.0 mL/minute at 25° C. as a mobile phase. An UV detector was used as a detector, and an absorbance at 228 nm was measured.

Example 5

Production of Organic EL Element

A glass substrate which had been patterned with an ITO thin film was used as the substrate, and an Al doped MoO$_3$ layer having the film thickness of 10 nm was deposited on this ITO thin film by the vacuum deposition method in the same procedure as in Example 2.

After forming the film, the substrate was brought out in the atmosphere, a film of the polymer compound 1 obtained in Synthesis Example 1 was formed on the deposition film by a spin coating method, thus forming an electron block layer having the film thickness of 20 nm. The film of the electron block layer formed at an extraction electrode section and a sealing area was removed, and then it was baked on a hotplate at 200° C. for 20 minutes.

Subsequently, a film of a macromolecular light-emitting organic material (RP158, supplied from Sumation Co., Ltd.) was formed on the electron block layer by the spin coating method to form a light-emitting layer having the film thickness of 90 nm. The film of the light-emitting layer formed in the extraction electrode section, and the sealing area was removed.

The process from this to the sealing was carried out in vacuum or in nitrogen, and the element under the process was not exposed to the atmosphere.

The substrate was heated at a substrate temperature of 100° C. for 60 minutes in a vacuum heating room. Subsequently, the substrate was transferred to the deposition chamber, and a cathode mask was aligned on the surface of the light-emitting layer so that a film of the cathode was formed in a light-emitting section and the extraction electrode section. Further, the cathode was deposited with rotating the musk and the substrate. As the cathode, a metal Ba was heated by a resistance heating method and deposited at the deposition rate of about 0.2 nm/second to make the film thickness 5 nm, and Al was deposited thereon at the deposition rate of about 0.2 nm/second using an electron beam deposition method to make the film thickness 150 nm.

Subsequently, the substrate was laminated on a previously prepared sealing glass, a periphery of which an UV curable resin had been applied, they were then kept in vacuum, subsequently backed to the condition at atmospheric pressure and fixed by irradiation with UV, thus producing an organic EL element having a light-emitting area of 2×2 nm. The resulting organic EL element had a layer constitution of a glass substrate/ITO film/Al doped MoO$_3$ layer/electron block layer/light-emitting layer/Ba layer/Al layer/sealing glass.

(Evaluation of Organic EL Element)

Electricity was run through the produced element so that a luminance was 1000 cd/m$^2$, and a current-voltage property was measured. In addition, the element was driven at constant current of 10 mA, the luminescence was started at an initial luminance of 2000 cd/m$^2$, and continued as it was to measure a light emission life. The results are shown in Tables 2 and 3. Compared with Comparative Example 2 described later, a maximum power efficiency is slightly higher, the driving voltage upon emitting the light at 1000 cd/m$^2$ is reduced and the lifetime is prolonged by about 1.6 times.

Example 6

An organic EL element was produced and the current-voltage property and the light emission life were measured by operating in the same manner as in Example 5, except that the film of the Al doped MoO$_3$ layer was formed in the same procedure as in not Example 2 but Example 3. The element was driven at constant current of 10 mA, the luminescence was started at an initial luminance of 2000 cd/m$^2$, and continued as it was to measure the light emission life. The results are shown in Tables 2 and 3. Compared with Comparative Example 2 described later, the maximum power efficiency is slightly higher, the driving voltage upon emitting the light at 1000 cd/m2 is reduced and the lifetime is prolonged by about 2.4 times.

Comparative Example 2

An organic EL element was produced and the current-voltage property and the light emission life were measured by operating in the same manner as in Example 5, except that the film of the MoO$_3$ layer was formed in the same procedure in Comparative Example 1 in place of forming the film of the Al doped MoO$_3$ layer. The element was driven at constant current of 10 mA, the luminescence was started at an initial brightness of 2000 cd/m$^2$, and continued as it was to measure the light emission life. The results are shown in Tables 2 and 3.

TABLE 2

Current-voltage property and light-emitting property

| | Maximum power efficiency (1 m/W) | Current density (A/cm$^2$) | Voltage (V) |
|---|---|---|---|
| Example 5 | 0.31 | 0.15 | 7.41 |
| Example 6 | 0.30 | 0.15 | 7.28 |
| Comparative Example 2 | 0.29 | 0.14 | 7.83 |

TABLE 3

Lifetime property

| | Light emission life (hr) |
|---|---|
| Example 5 | 235.6 |
| Example 6 | 361.7 |
| Comparative Example 2 | 149.7 |

The invention claimed is:

1. An organic electroluminescence element comprising: an anode; a light-emitting layer; a cathode; a metal doped molybdenum oxide layer provided between the anode and the light-emitting layer; and a layer that contains a polymer compound on the metal doped molybdenum oxide layer and that has been formed by a wet process, wherein:
   the metal doped molybdenum oxide layer contains 98% by weight or more of the molybdenum oxide and the dopant metal, and a content ratio of the dopant metal in the metal doped molybdenum oxide is 1.3 to 3.5 mol %; and
   the dopant metal is aluminum.

2. The organic electroluminescence element according to claim 1, wherein the metal doped molybdenum oxide layer is a hole injection layer, or is provided in direct contact with the light-emitting layer or the hole injection layer.

3. The organic electroluminescence element according to claim 1, wherein a visible light transmittance of the metal doped molybdenum oxide layer is 50% or more.

4. A method for producing an organic electroluminescence element according to claim 1, comprising:
- a stacking step of simultaneously depositing molybdenum oxide and a dopant metal on any layer selected from the group consisting of an anode, a hole injection layer, a hole transport layer, to obtain a metal doped molybdenum; and
- a step of forming a layer containing a polymer compound on the metal doped molybdenum oxide layer by a wet process, and wherein the metal is an aluminum.

5. The method according to claim 4, wherein the stacking step is carried out by vacuum deposition, sputtering or ion plating.

6. The method according to claim 5, wherein oxygen is introduced into an atmosphere in the stacking step.

7. The method according to claim 4 further comprising a step of heating the metal doped molybdenum oxide layer subsequent to the stacking step, before conducting a stacking step to form another layer different from the metal doped molybdenum oxide layer.

* * * * *